US009230866B2

(12) United States Patent
Lee et al.

(10) Patent No.: US 9,230,866 B2
(45) Date of Patent: Jan. 5, 2016

(54) FABRICATING METHOD OF CUSTOMIZED MASK AND FABRICATING METHOD OF SEMICONDUCTOR DEVICE USING CUSTOMIZED MASK

(71) Applicants: Jae-Han Lee, Seoul (KR); Hoo-Sung Cho, Yongin-si (KR); Cheol-Hong Kim, Yongin-si (KR); Seung-Hak Park, Hwaseong-si (KR)

(72) Inventors: Jae-Han Lee, Seoul (KR); Hoo-Sung Cho, Yongin-si (KR); Cheol-Hong Kim, Yongin-si (KR); Seung-Hak Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 57 days.

(21) Appl. No.: 14/140,775

(22) Filed: Dec. 26, 2013

(65) Prior Publication Data

US 2014/0199789 A1 Jul. 17, 2014

(30) Foreign Application Priority Data

Jan. 14, 2013 (KR) ........................ 10-2013-0004046

(51) Int. Cl.

| | | |
|---|---|---|
| *H01L 21/027* | (2006.01) | |
| *H01L 21/66* | (2006.01) | |
| *H01L 21/311* | (2006.01) | |
| *G03F 1/70* | (2012.01) | |
| *H01L 27/115* | (2006.01) | |
| *G03F 1/84* | (2012.01) | |

(52) U.S. Cl.
CPC *H01L 22/12* (2013.01); *G03F 1/70* (2013.01); *H01L 21/31144* (2013.01); *G03F 1/84* (2013.01); *H01L 27/11556* (2013.01); *H01L 27/11582* (2013.01)

(58) Field of Classification Search
CPC . H01L 21/027; H01L 22/12; H01L 21/31144; H01L 27/115; H01L 27/11556; H01L 27/11582; G03F 1/42; G03F 1/84; G03F 1/70
See application file for complete search history.

(56) References Cited

U.S. PATENT DOCUMENTS

| | | | | |
|---|---|---|---|---|
| 5,326,659 | A | * | 7/1994 | Liu et al. ............................ 430/5 |
| 5,620,916 | A | * | 4/1997 | Eden et al. .................... 716/112 |
| 5,783,342 | A | * | 7/1998 | Yamashita et al. .............. 430/30 |
| 5,959,325 | A | * | 9/1999 | Adair et al. .................... 257/302 |
| 6,275,971 | B1 | * | 8/2001 | Levy et al. ..................... 716/136 |
| 6,316,328 | B1 | * | 11/2001 | Komuro ........................ 438/401 |
| 6,455,211 | B1 | * | 9/2002 | Yui et al. ......................... 430/22 |
| 6,457,163 | B1 | * | 9/2002 | Yang .............................. 716/125 |
| 6,484,302 | B1 | * | 11/2002 | Freymuth ...................... 716/122 |
| 6,753,611 | B1 | * | 6/2004 | Maeno et al. ................. 257/774 |
| 6,804,808 | B2 | * | 10/2004 | Li et al. ........................... 716/52 |

(Continued)

FOREIGN PATENT DOCUMENTS

| | | |
|---|---|---|
| JP | 2010-225694 A | 10/2010 |
| KR | 10-2009-0110553 A | 10/2009 |
| KR | 10-2012-077031 A | 7/2012 |

*Primary Examiner* — Mary Wilczewski
(74) *Attorney, Agent, or Firm* — Lee & Morse, P.C.

(57) ABSTRACT

A fabricating method of a customized mask includes forming first patterns in a mold structure, forming second patterns in the mold structure using initial masks, the mold structure having the first patterns formed therein, measuring overlap failure between the first patterns and the second patterns, and fabricating customized masks by compensating for pattern positions of the initial masks based on the measuring results, wherein compensating for the pattern positions of the initial masks includes shifting positions of at least some patterns of the initial masks according to shift directions and sizes of at least some of the first patterns.

20 Claims, 14 Drawing Sheets

(56) References Cited

U.S. PATENT DOCUMENTS

| | | |
|---|---|---|
| 6,832,360 B2 * | 12/2004 | Li .................... 716/112 |
| 6,871,332 B2 * | 3/2005 | Li et al. ............ 716/112 |
| 6,883,149 B2 * | 4/2005 | Li et al. ............ 716/112 |
| 6,892,368 B2 * | 5/2005 | Li et al. ............ 716/112 |
| 6,895,568 B2 * | 5/2005 | Li .................... 716/112 |
| 7,007,258 B2 * | 2/2006 | Li .................... 716/122 |
| 7,076,750 B1 * | 7/2006 | Lukanc ............. 716/52 |
| 7,096,447 B1 * | 8/2006 | Li et al. ............ 716/112 |
| 7,122,281 B2 | 10/2006 | Pierrat |
| 7,178,114 B2 * | 2/2007 | Lin et al. .......... 716/122 |
| 7,312,141 B2 * | 12/2007 | Dunham et al. .... 438/597 |
| 7,332,812 B2 * | 2/2008 | Herold et al. ...... 257/758 |
| 8,154,068 B2 | 4/2012 | Katsumata et al. |
| 8,266,553 B1 * | 9/2012 | Nguyen et al. ..... 716/51 |
| 8,539,412 B2 * | 9/2013 | Arayama et al. ... 716/111 |
| 8,744,493 B2 * | 6/2014 | Czaja et al. ........ 455/456.4 |
| 8,799,845 B2 * | 8/2014 | Scanlan et al. ..... 716/119 |
| 2002/0019729 A1 * | 2/2002 | Chang et al. ....... 703/6 |
| 2002/0035461 A1 * | 3/2002 | Chang et al. ....... 703/13 |
| 2004/0229171 A1 * | 11/2004 | Chen .................. 430/320 |
| 2005/0073671 A1 * | 4/2005 | Borodovsky ....... 355/77 |
| 2007/0009808 A1 * | 1/2007 | Abrams et al. ..... 430/5 |
| 2007/0011647 A1 * | 1/2007 | Abrams et al. ..... 716/21 |
| 2007/0077500 A1 * | 4/2007 | Baidya et al. ...... 430/5 |
| 2007/0184357 A1 * | 8/2007 | Abrams et al. ..... 430/5 |
| 2007/0186206 A1 * | 8/2007 | Abrams et al. ..... 716/19 |
| 2007/0190811 A1 * | 8/2007 | Park et al. .......... 438/800 |
| 2010/0064273 A1 * | 3/2010 | Credendino et al. ... 716/19 |
| 2011/0156132 A1 | 6/2011 | Kiyotoshi |
| 2011/0194752 A1 * | 8/2011 | Pang .................. 382/149 |
| 2011/0209106 A1 * | 8/2011 | Cheng et al. ....... 716/55 |
| 2011/0216597 A1 | 9/2011 | Higashi et al. |
| 2012/0098050 A1 | 4/2012 | Shim et al. |
| 2012/0213009 A1 | 8/2012 | Aritome et al. |
| 2013/0149636 A1 * | 6/2013 | Gyoda et al. ....... 430/5 |
| 2013/0240480 A1 * | 9/2013 | Suzuki et al. ...... 216/41 |
| 2013/0283219 A1 * | 10/2013 | Fujimura et al. ... 716/53 |
| 2014/0178803 A1 * | 6/2014 | Yoo et al. ........... 430/5 |
| 2014/0199789 A1 * | 7/2014 | Lee et al. ........... 438/7 |

\* cited by examiner

FABRICATING METHOD OF CUSTOMIZED MASK AND FABRICATING METHOD OF SEMICONDUCTOR DEVICE USING CUSTOMIZED MASK

CROSS-REFERENCE TO RELATED APPLICATION

Korean Patent Application No. 10-2013-0004046, filed on Jan. 14, 2013, in the Korean Intellectual Property Office, and entitled: "Fabricating Method Of Customized Mask and Fabricating Method Of Semiconductor Device Using Customized Mask," is incorporated by reference herein in its entirety.

BACKGROUND

1. Field

Embodiments relate to a fabricating method of a customized mask and a fabricating method of a semiconductor device using the customized mask.

2. Description of the Related Art

A mask is formed of a sheet made of a metal or other materials having a circuit pattern formed therein and is used to shield a particular portion or surface to provide for selective deposition or etching in the manufacture of a semiconductor device. As the integration level of a semiconductor device increases, masks based on optical proximity correction (OPC) or resolution enhanced technology (RET), a phase shift mask, or the like, are widely employed for enhancing the resolution of the semiconductor device.

SUMMARY

Embodiments provide a fabricating method of a customized mask, which can improve overlap failure between each of a plurality of patterns.

Embodiments also provide a fabricating method of a semiconductor device using the customized mask, which can improve overlap failure between each of a plurality of patterns.

According to an aspect of embodiments, there is provided a fabricating method of a customized mask, the fabricating method including forming first patterns in a mold structure, forming second patterns in the mold structure using initial masks, the mold structure having the first patterns formed therein, measuring overlap failure between the first patterns and the second patterns, and fabricating customized masks by compensating for pattern positions of the initial masks based on the measuring results, wherein compensating for the pattern positions of the initial masks includes shifting positions of at least some patterns of the initial masks according to shift directions and sizes of at least some of the first patterns.

The fabricating method may further include performing a high-temperature process on the mold structure, before forming the second patterns using the initial masks, such that the mold structure shrinks or expands.

Compensating for the pattern positions may further include shifting the positions of the at least some patterns of the initial masks in a same direction as a direction in which the mold structure shrinks or expands.

Compensating for the pattern positions may further include continuously varying the shift directions and sizes of at least some of the patterns of the initial masks.

Compensating for the pattern positions may further include gradually varying the shift directions and sizes of at least some of the patterns of the initial masks.

Compensating for the pattern positions by gradually varying the shift directions and sizes of at least some of the patterns of the initial masks may include using non-continuous sections of the patterns of the initial masks.

Compensating for the pattern positions may be performed in a unit of at least one mold structure disposed within at least one shot.

Compensating for the pattern positions may be performed symmetrically in left and right directions relative to a center of the mold structure.

According to another aspect of embodiments, there is provided a fabricating method of a customized mask, the fabricating method including forming first patterns in a mold structure, forming second patterns in the mold structure using initial masks, the mold structure having the first patterns formed therein, measuring overlap failure between the first patterns and the second patterns, fabricating customized masks by compensating for pattern positions of the initial masks based on the measuring results, and patterning a plurality of layers on a substrate with the customized masks to form separating spaces between adjacent channel patterns, wherein compensating for the pattern positions of the initial masks includes shifting positions of at least some patterns of the initial masks according to shift directions and sizes of at least some of the first patterns.

The fabricating method may further include performing a high-temperature process on the mold structure, before forming the second patterns using the initial masks, such that the mold structure shrinks or expands.

Compensating for the pattern positions may further include shifting the positions of the at least some patterns of the initial masks in a same direction as a direction in which the mold structure shrinks or expands.

Compensating for the pattern positions may further include continuously varying the shift directions and sizes of at least some of the patterns of the initial masks.

Compensating for the pattern positions may further include gradually varying the shift directions and sizes of at least some of the patterns of the initial masks.

Compensating for the pattern positions by gradually varying the shift directions and sizes of at least some of the patterns of the initial masks may include using non-continuous sections of the patterns of the initial masks.

Compensating for the pattern positions may be performed symmetrically in left and right directions relative to a center of the mold structure.

According to yet another aspect of embodiments, there is provided a fabricating method of a customized mask, the fabricating method including forming first patterns in a mold structure to form a patterned mold structure, performing a high-temperature process on the patterned mold structure, such that a width of the mold structure changes, forming second patterns in the reduced width mold structure using initial masks, measuring overlap failure between the first patterns and the second patterns, and fabricating customized masks by shifting positions of at least some patterns of the initial masks according to shift directions and sizes of at least some of the first patterns after the high-temperature process to minimize overlap failure between the first patterns and the second patterns.

Measuring overlap failure between the first patterns and the second patterns may include measuring alignment between the first and second patterns.

Measuring alignment between the first and second patterns may include measuring a first distance between a left sidewall of a second pattern and an adjacent respective side of an overlapping first pattern, measuring a second distance between a right sidewall of the second pattern and an adjacent respective side of the overlapping first pattern, and comparing the first distance to the second distance.

Fabricating the customized masks may include adjusting a distance between adjacent mask patterns, such that a difference between the first and second distances is minimized.

Fabricating the customized masks may include adjusting a distance between adjacent patterns of the customized masks based on the measuring results, such that the first patterns are centered with respect to the second patterns.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
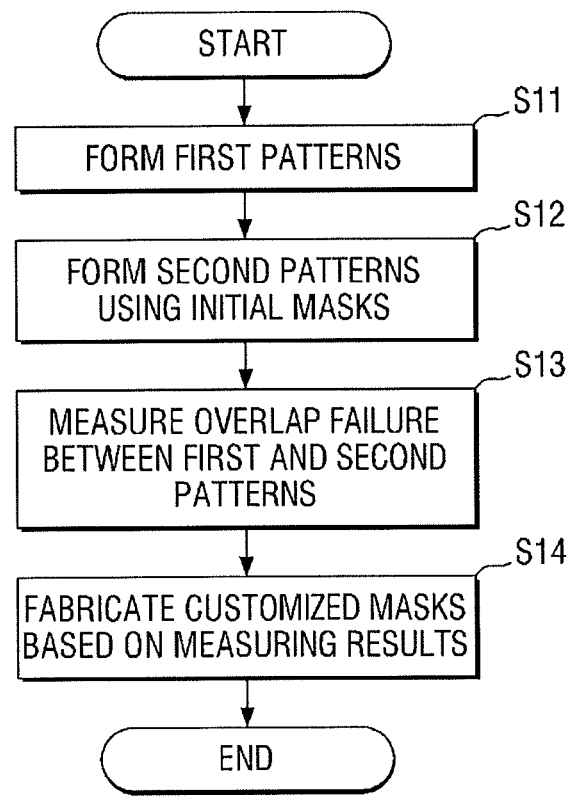
FIG. 1 illustrates a flowchart of a fabricating method of a customized mask according to a first embodiment.

Embodiments will now be described more fully hereinafter with reference to the accompanying drawings. Embodiments may, however, be embodied in different forms and should not be construed as limited to those set forth herein. Rather, these embodiments are provided so that this disclosure will be thorough and complete, and will fully convey the scope of exemplary implementations to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Embodiments will be described with reference to perspective views, cross-sectional views, and/or plan views. Thus, the profile of an exemplary view may be modified according to manufacturing techniques and/or allowances. That is, the embodiments are not intended to limit the scope of the exemplary implementations but cover all changes and modifications that can be caused due to a change in manufacturing process. Thus, regions shown in the drawings are illustrated in schematic form and the shapes of the regions are presented simply by way of illustration and not as a limitation.

Hereinafter, a fabricating method of a customized mask according to a first embodiment will be described with reference to FIGS. 1 to 9D.

FIG. 1 illustrates a flowchart of a fabricating method of a customized mask according to a first embodiment.

Referring first to FIG. 1, the fabricating method of a customized mask according to a first embodiment includes forming first patterns 111 in a mold structure 110 (S11). Formation of the first patterns 111 in the mold structure 110 will be described in detail with reference to FIGS. 1-4B.

Figure 2:
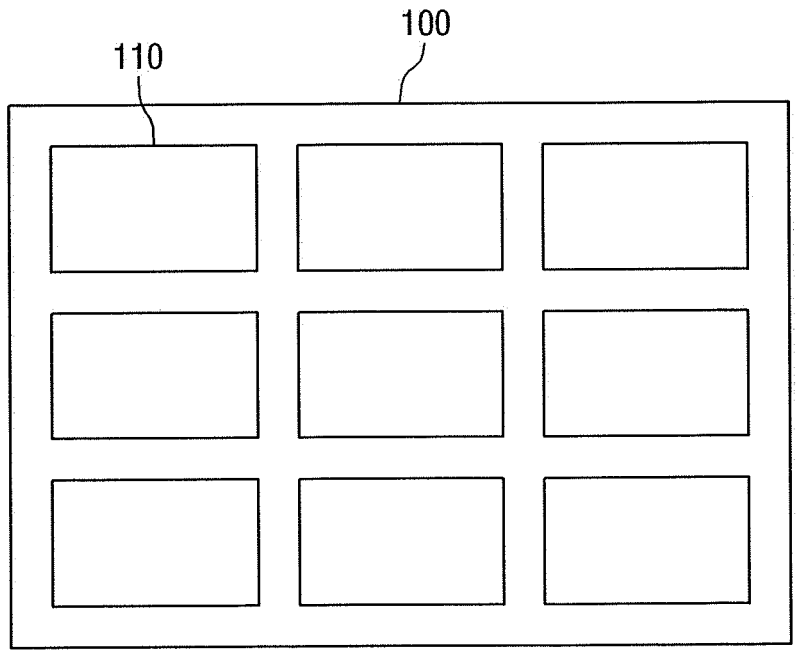
FIG. 2 illustrates a plan view of a shot having a plurality of mold structures disposed therein.

Referring to FIG. 2, a plurality of mold structures 110 for fabricating a semiconductor device are disposed in a shot 100. For example, nine (9) mold structures 110 may be disposed on a single shot 100, as exemplified in FIG. 2, but embodiments are not limited thereto.

Figure 3A:
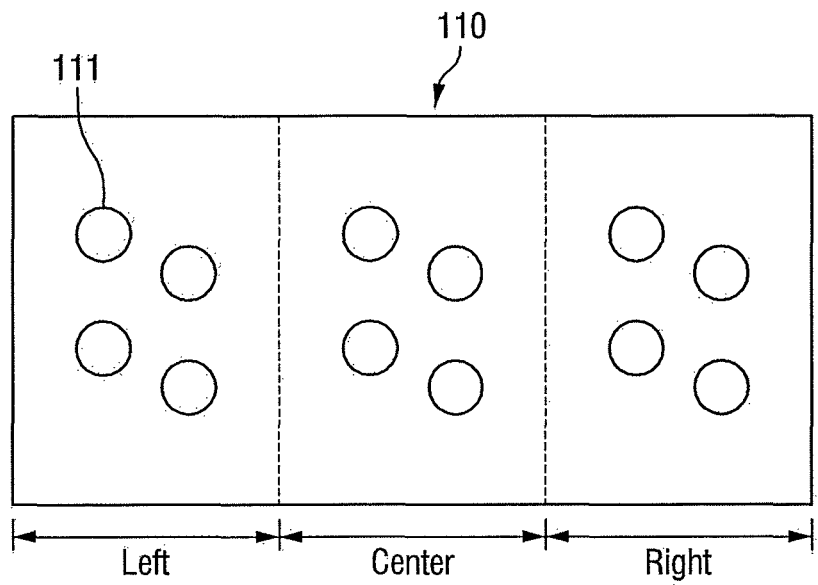
FIG. 3A illustrates a plan view of a mold structure having first patterns formed therein.
Figure 3B:
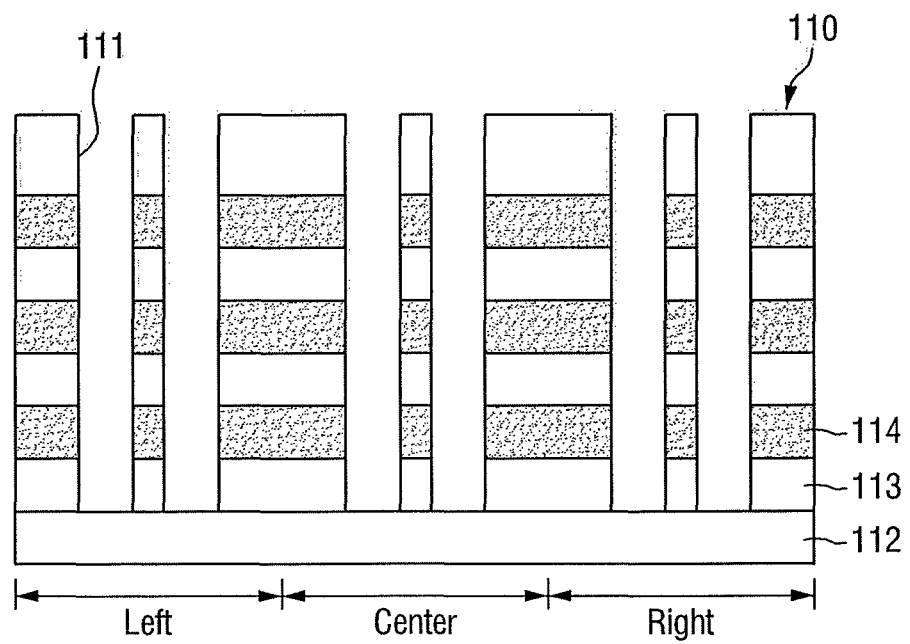
FIG. 3B illustrates a cross-sectional view of the mold structure in FIG. 3A.

Referring to FIGS. 3A and 3B, the mold structure 110 may include multiple regions, e.g., left, center, and right regions. For brevity, in FIG. 3A, the mold structure 110 is divided into left, center, and right regions in a one dimensional manner, but embodiments are not limited thereto. For example, as will be described later with reference to FIG. 11, the mold structure 110 may be divided into multiple regions in a two dimensional manner.

As illustrated in FIG. 3A, a plurality of first patterns 111 may be formed in each of the left, center, and right regions of the mold structure 110 to be spaced apart from each other. As an example, the first patterns 111 may be channel holes vertically passing through the mold structure 110. Four (4) first patterns 111 formed in each of the left, center, and right regions of the mold structure 110 are exemplified in FIG. 3A, but embodiments are not limited thereto.

As illustrated in FIG. 3B, the mold structure 110 may include multiple layers 113 and 114 sequentially stacked on a substrate 112. The multiple layers 113 and 114 may include, e.g., multiple silicon oxide layers 113 and multiple silicon nitride layers 114. The multiple silicon oxide layers 113 may be sequentially stacked to be spaced apart from each other in a first direction (e.g., in an up and down direction of FIG. 3B). As shown in FIG. 3B, the multiple silicon oxide layers 113 may be formed to extend lengthwise in a second direction (e.g., in a left and right direction of FIG. 3B). The silicon oxide layers 113 may be formed of, e.g., $SiO_2$, but embodiments are not limited thereto.

The multiple silicon nitride layers 114 may be sequentially stacked between each of the stacked multiple silicon oxide layers 113 in the first direction. As shown in FIG. 3B, the multiple silicon nitride layers 114 may be formed to lengthwise extend in the second direction. The silicon nitride layers 114 may be formed of, e.g., SiN, but embodiments are not limited thereto.

The first patterns 111 may lengthwise extend in the respective regions, i.e., left, center and right directions of the mold structure 110, in the first direction to be spaced apart from each other. The first patterns 111 may be formed to pass through the stacked multiple layers 113 and 114 to expose the substrate 112. The first patterns 111 may be formed to cross the stacked multiple layers 113 and 114.

Figure 4A:
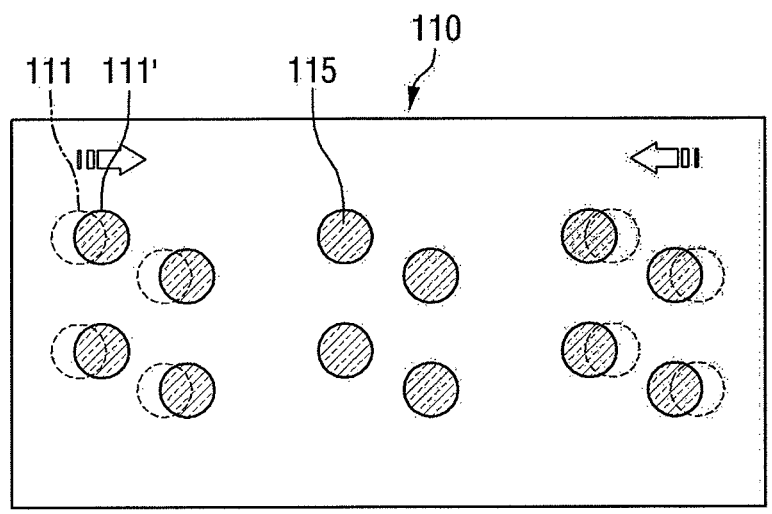
FIG. 4A illustrates a plan view of the position shifting of the first patterns.
Figure 4B:
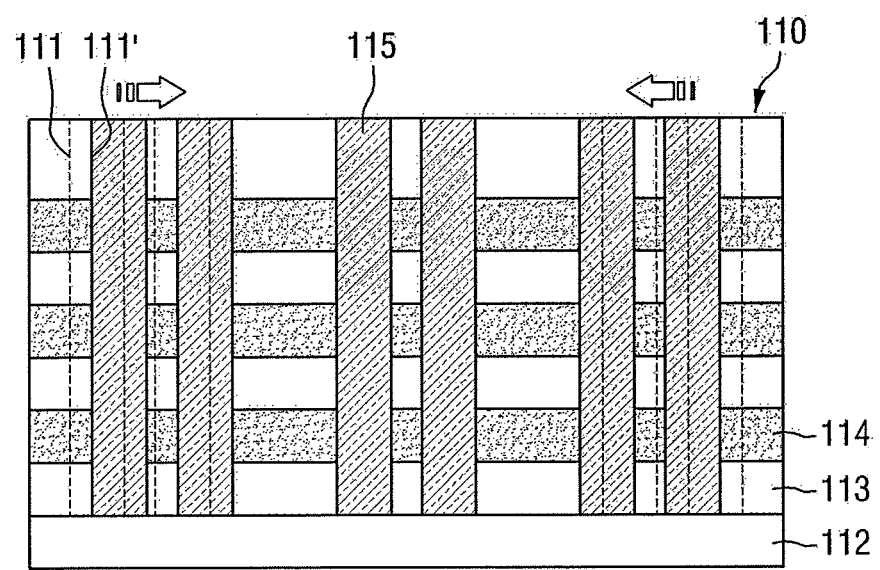
FIG. 4B illustrates a cross-sectional view of the position shifting of the first patterns shown in FIG. 4A.

Next, as illustrated in FIGS. 4A-4B, intermediate wiring patterns 115 filling the first patterns 111 may be formed, e.g., the intermediate wiring patterns 115 may completely fill the first patterns 111 to have the mold structure 110 with an entirely flat upper surface. The intermediate wiring patterns 115 may include information storage patterns, channel patterns, or the like. The information storage patterns may be formed on sidewalls of the first patterns 111. The channel patterns filling the first patterns 111 including the information storage patterns may be formed. The channel patterns may be made of, e.g., a semiconductor material, such as polysilicon, but embodiments are not limited thereto. In such a manner, the information storage patterns may be disposed between the channel patterns and the stacked multiple layers 113 and 114. The information storage patterns may be formed by, e.g., a high-temperature thermal process.

FIGS. 4A and 4B illustrate the high-temperature thermal process for forming the information storage patterns.

Referring to FIGS. 4A and 4B, after filling the first patterns 111 with the intermediate wiring patterns 115, the mold structure 110 may be processed in a high-temperature thermal process to form the information storage patterns in the intermediate wiring patterns 115. However, such a high-temperature thermal process may cause the mold structure 110 to shrink toward the center region, so positions of at least some patterns of the first patterns 111 formed in the mold structure 110 may shift toward the center region. Reference numeral 111 is used to denote original positions of the first patterns 111 in a case where the mold structure 110 does not undergo shrinkage (dashed lines), and reference numeral 111' is used to denote shifted positions of the first patterns 111 in a case where the mold structure 110 shrinks (solid lines). The position shifting occurs in unit of the mold structure 110 disposed in the shot 100, e.g., the position shifting may occur symmetrically in left and right sides in view of the center of the mold structure 110, and the position shifting of the first patterns 111 due to shrinkage of the mold structure 110 cannot be corrected by photoresist.

In FIGS. 4A and 4B, the mold structure 110 undergoes shrinkage, which is, however, provided only for illustration, but embodiments are not limited thereto. This may also apply to a case where the mold structure 110 undergoes expansion.

Next, referring back to FIG. 1, second patterns are formed in the mold structure 110 using initial masks 130 having the first patterns 111 formed therein (S12). Formation of the second patterns in the mold structure 110 will be described in detail with reference to FIGS. 5A-6.

Figure 5A:
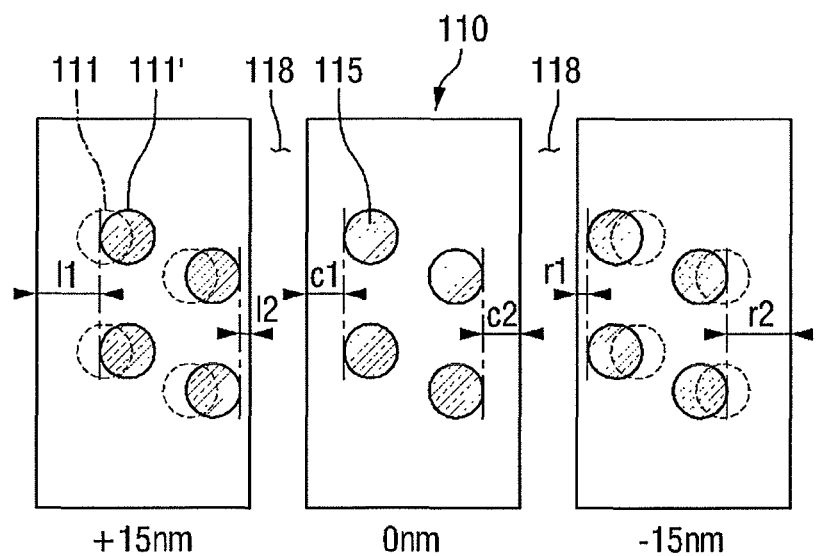
FIG. 5A illustrates a plan view of second patterns formed using initial masks.
Figure 5B:
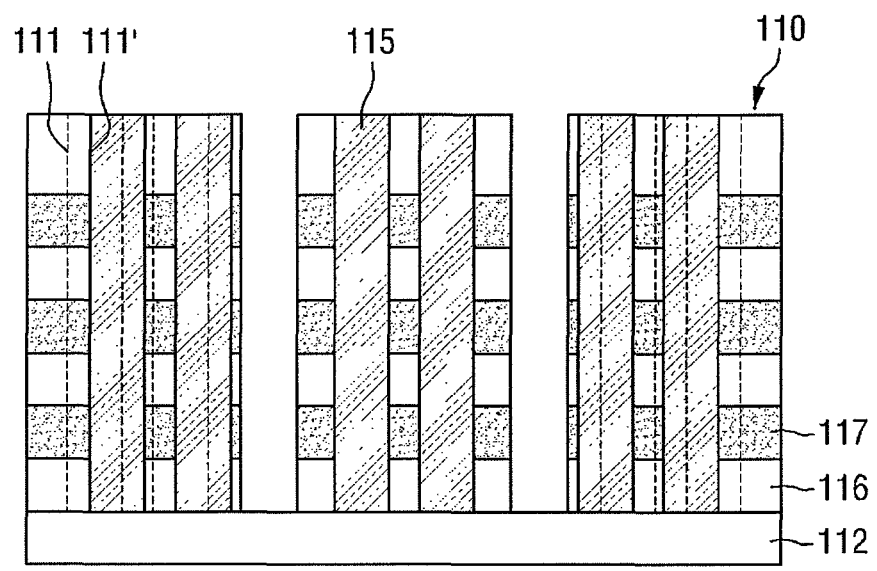
FIG. 5B illustrates a cross-sectional view of the second patterns in FIG. 5A.

Referring to FIGS. 5A and 5B, the stacked multiple layers 113 and 114 of the mold structure 110 are patterned to form separating spaces 118 exposing portions of the substrate 112. As an example, as illustrated in FIG. 5A-5B, the mold structure 110 with the first patterns 111, which are filled with the intermediate wiring patterns 115, undergoes a second patterning process, e.g., after the first patterning process forming the first patterns 111, to form the separating spaces 118. The separating spaces 118 separate adjacent second patterns, e.g., a patterned silicon oxide pattern 116 and a patterned silicon nitride pattern 117.

Figure 6:
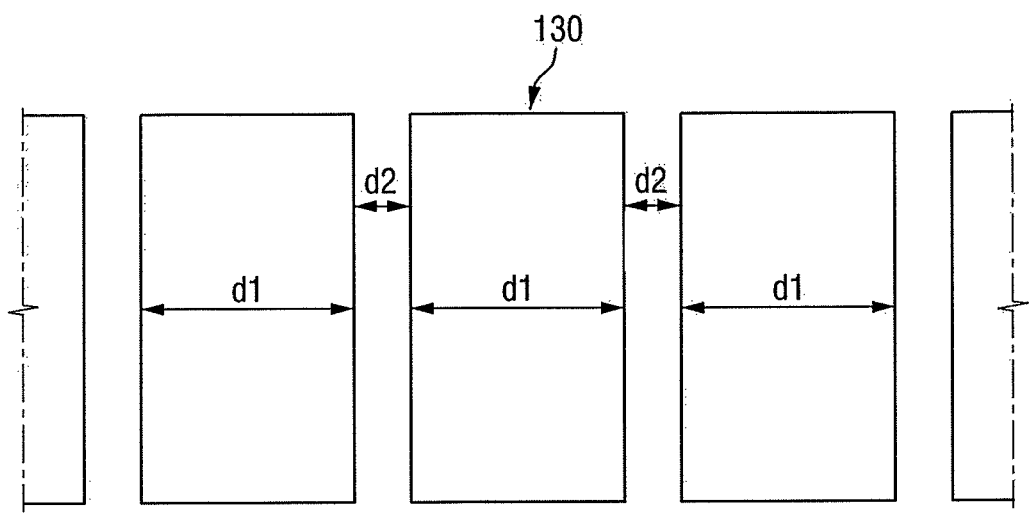
FIG. 6 illustrates initial masks for forming original second patterns.

FIG. 6 illustrates the initial masks 130 for forming the second patterns. As shown in FIG. 6, patterns of the initial masks 130 include mask patterns for forming original second patterns 116 and 117 according to a layout compliant with the design rule. As an example, the patterns of the initial masks 130 may include mask patterns for forming the original second patterns 116 and 117 with a first width d1, and mask patterns for forming the separating spaces 118 with a second width d2 between neighboring second patterns 116 and 117. For example, the initial masks 130 may be positioned over the mold structure 110 with the first patterns 111, which are filled with the intermediate wiring patterns 115, so the mold structure 110 may be patterned through the initial masks 130.

Referring back to FIGS. 5A and 5B, since at least some of the first patterns 111 shift in positions due to shrinkage of the mold structure 110, overlap failure may be created between the first patterns 111 and the second patterns 116 and 117 in a case where the second patterns 116 and 117 are formed using the initial masks 130.

Next, referring back to FIG. 1, the overlap failure created between the first patterns 111 and the second patterns 116 and 117 is measured (S13). The measuring of the overlap failure may be performed using a scanning electron microscope (SEM). If necessary, the semiconductor device fabricated using the initial masks 130 may be cut along a horizontal axis to be subjected to a destructive test.

Referring back to FIG. 5A, in order to measure an overlap failure between the first patterns 111 and the second patterns 116 and 117, e.g., distances between the first patterns 111 and sidewalls of the second patterns 116 and 117 may be measured. For example, as shown in FIG. 5A, first values l1, c1 and r1 of distances between one sidewall of each of the second patterns 116 and 117 (e.g., a left sidewall in each second pattern) and an adjacent first pattern 111 (e.g., a left side of a closest first pattern 111 overlapping the second pattern) may be measured, and second values l2, c2 and r2 of distances between the other sidewall of each of the second patterns 116 and 117 (e.g., a right sidewall in each pattern) and an adjacent first pattern 111 (e.g., a right side of a closest the first pattern 111 overlapping the second pattern) may be measured. Overlap failure measuring results may be parameterized by dividing deviations of the first values and the second values, i.e., of a same pattern, by two (2), e.g., dividing by two (2) a difference between respective first and second values.

As described above with reference to FIGS. 4A and 4B, the shifting of positions of the first patterns 111 due to shrinkage of the mold structure 110 is performed symmetrically in left and right directions of the center of the mold structure 110. As confirmed from the overlap failure measuring results shown in FIG. 5A, the overlap failures are +15 nm, 0 nm, and (−15) nm in left, center, and right regions of the mold structure 110, respectively. An overlap failure having a positive value means that the first patterns 111 are formed to lean toward the right side, and an overlap failure having a negative value means that the first patterns 111 are formed to lean toward the left side.

In FIG. 5A, the measuring of the overlap failure between the first patterns 111 and the second patterns 116 and 117 includes measuring distances between the first patterns 111 and sidewalls of the second patterns 116 and 117, but aspects of embodiments are not limited thereto. Various methods that are well known in the art, including measuring distances between centers of the first patterns 111 and centers of the second patterns 116 and 117, measuring distances between centers of the first patterns 111 and sidewalls of the second patterns 116 and 117, and so on, may be used in measuring the overlap failure between the first patterns 111 and the second patterns 116 and 117.

Next, referring back to FIG. 1, customized masks 140 are formed by compensating for positions of patterns of the initial masks 130 based on the measuring results (S14). Here, the positions of patterns of the initial masks 130 are compensated for by shifting positions of at least some of the patterns for forming the second patterns 116 and 117 of the initial masks 130, according to the shift directions and sizes of at least some of the first patterns 111. The position shifting may be performed in unit of the mold structure 110 disposed in the shot 100.

Figure 7:
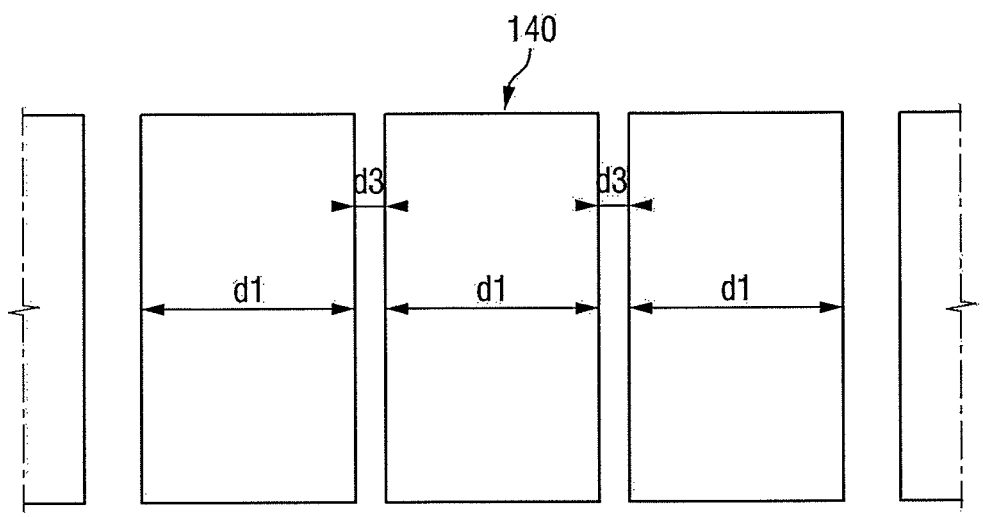
FIG. 7 illustrates customized masks for forming modified second patterns.

FIG. 7 illustrates customized masks (140) for forming modified second patterns 116 and 117.

As shown in FIG. 7, patterns of the customized masks 140 may include mask patterns for forming the modified second patterns 116 and 117 based on the overlap failure measuring results. As an example, the patterns of the customized masks 140 may include mask patterns for forming the modified second patterns 116 and 117 by shifting positions of the second patterns 116 and 117 according to the shift directions and sizes of at least some of the first patterns 111.

Compared to the initial masks 130 shown in FIG. 6, the customized masks 140 undergo position shifting in such a way that the mask patterns for forming the second patterns 116 and 117 having a first width d1 are shifted in the same direction as a direction in which the mold structure 110 shrinks, i.e., toward the center region. The position shifting of the mask patterns for forming the second patterns 116 and 117 may be performed symmetrically in left and right directions of the center of the mold structure 110. In addition, the customized masks 140 may include patterns for forming the separating spaces 118 having a third width d3 between neighboring second patterns 116 and 117. The third width d3 may be smaller than the second width d2 for providing for improved alignment between the first patterns 111 and the second patterns 116 and 117.

Figure 8A:
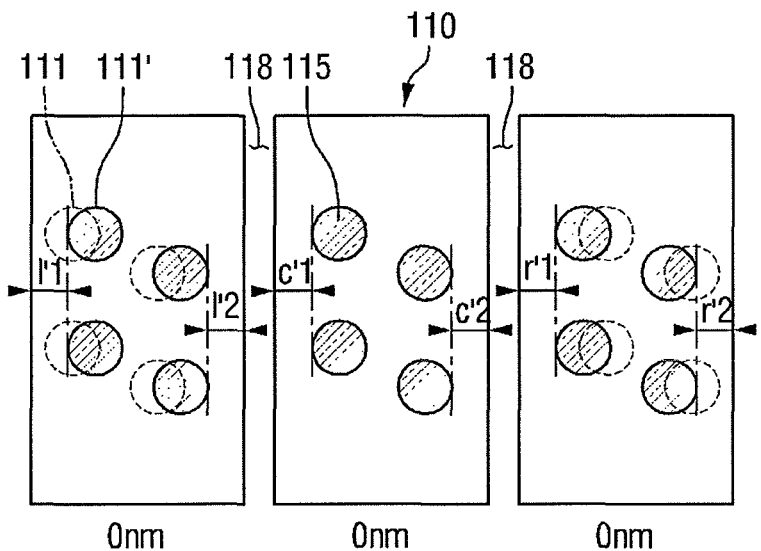
FIG. 8A illustrates a plan view of second patterns formed using customized masks.
Figure 8B:
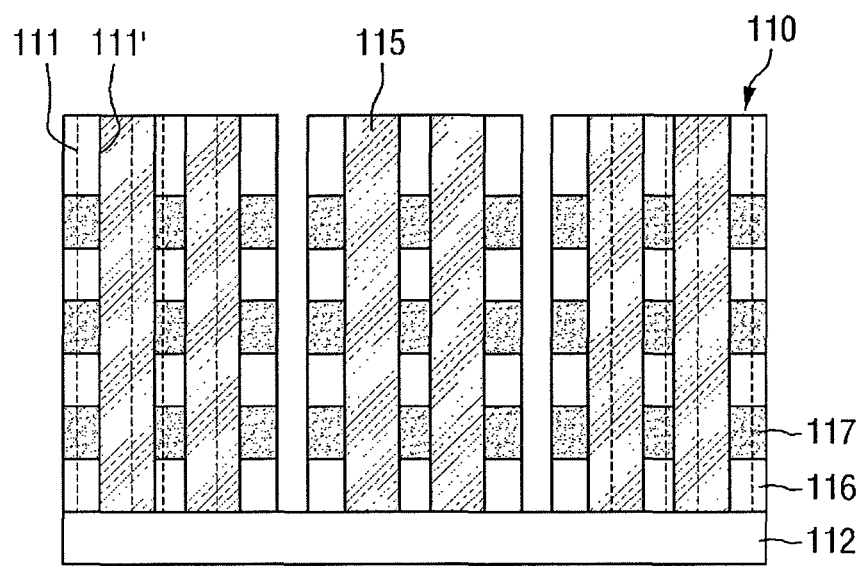
FIG. 8B illustrates a cross-sectional view of the second patterns in FIG. 8A.

Referring to FIGS. 8A and 8B, the second patterns 116 and 117 formed using the customized masks 140 may establish improved alignment with the first patterns 111, as intended by the layout compliant with the design rule. Since the positions of the second patterns 116 and 117 have been intentionally shifted using the customized masks 140, overlap failure between the first patterns 111 and the second patterns 116 and 117, resulting from shrinkage of the mold structure 110, may be prevented or substantially minimized. First values l1', c1', and r1' of distances between one sidewall of each of the second patterns 116 and 117 (e.g., a left sidewall) and an adjacent first pattern 111 may be measured, and second values l2', c2', and r2' of distances between the other sidewall of each of the second patterns 116 and 117 (e.g., a right sidewall) and an adjacent first pattern 111 may then be measured. In this case, as confirmed from overlap failure measuring results shown in FIG. 8A, the overlap failure is 0 nm in all regions of the mold structure 110. For example, as illustrated in FIG. 8A, the first patterns 111 are aligned to be centered with respect to the second patterns. If an overlap failure still exists, without being removed, e.g., if the first and second patterns are still misaligned, the process of forming the customized masks 140 based on the overlap failure measuring results may be repeatedly performed until the overlap failure is removed.

FIGS. 9A to 9D illustrate graphs for explaining overlap failure measuring results in a case of using the initial masks 130 or the customized masks 140. In each graph, the abscissa indicates a discrete mold structure 110, and the ordinate indicates overlap failure measuring data.

Figure 9A:
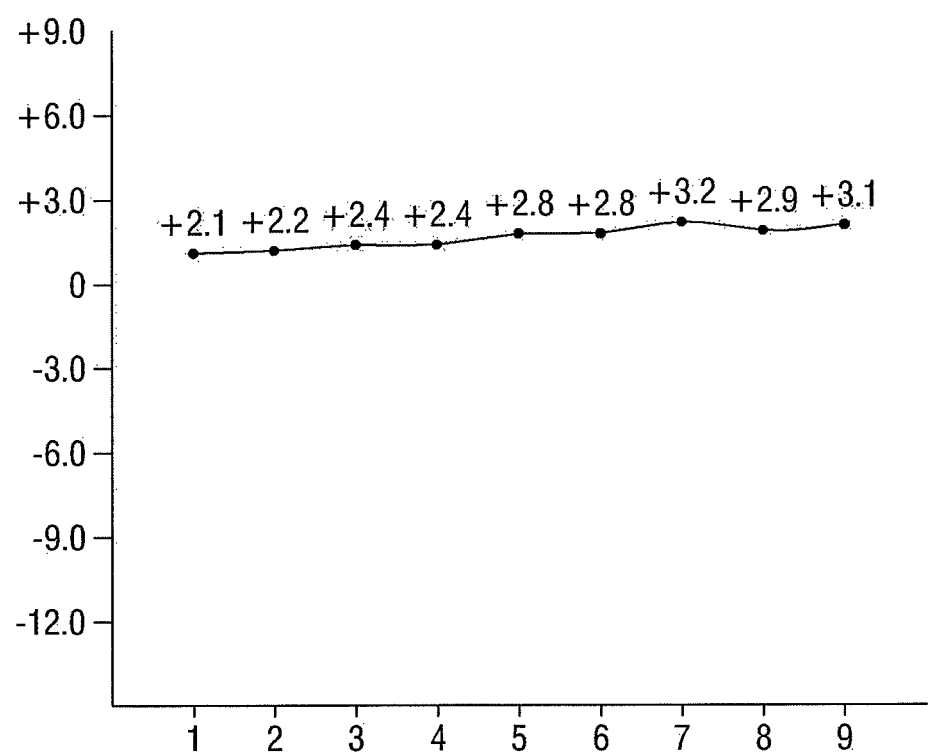
FIGS. 9A to 9D illustrate graphs for explaining overlap failure measuring results in a case of using initial masks or customized masks.
Figure 9B:
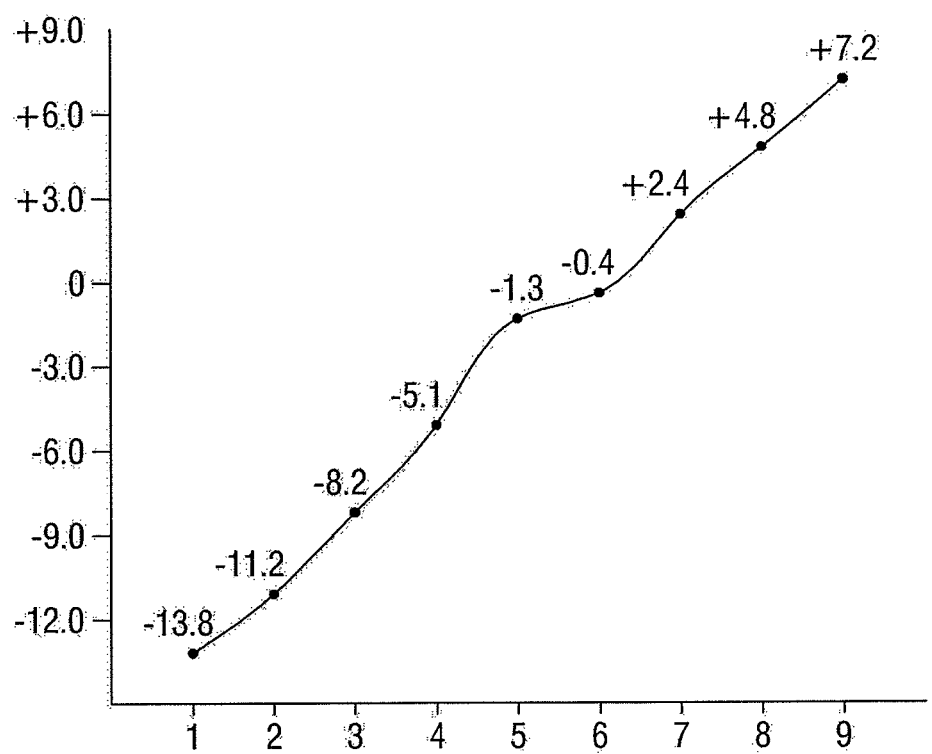
Figure 9C:
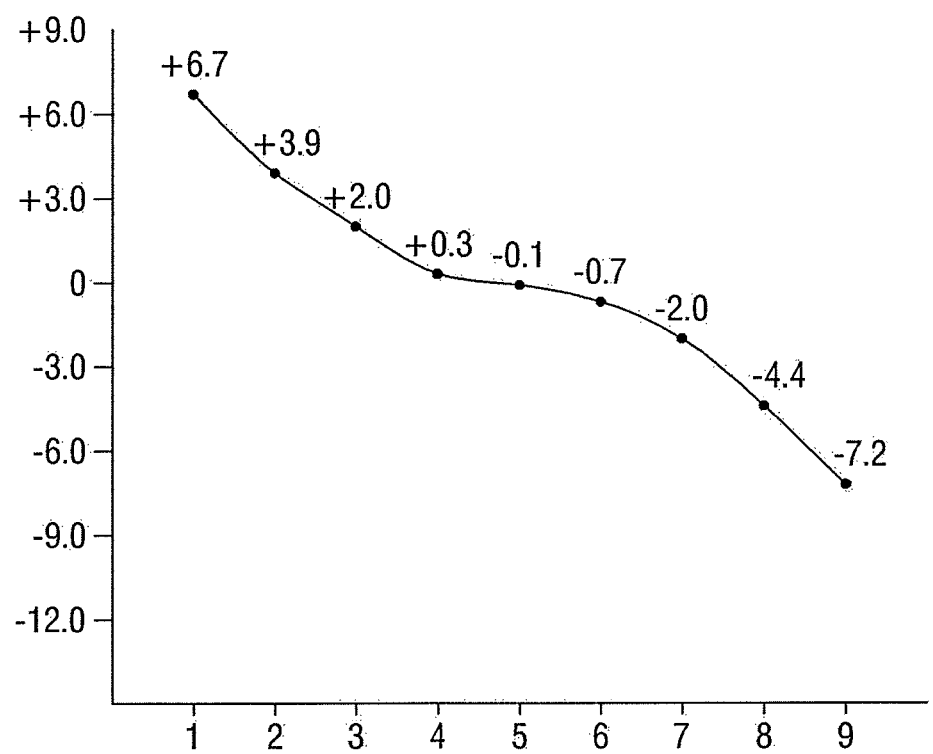
Figure 9D:
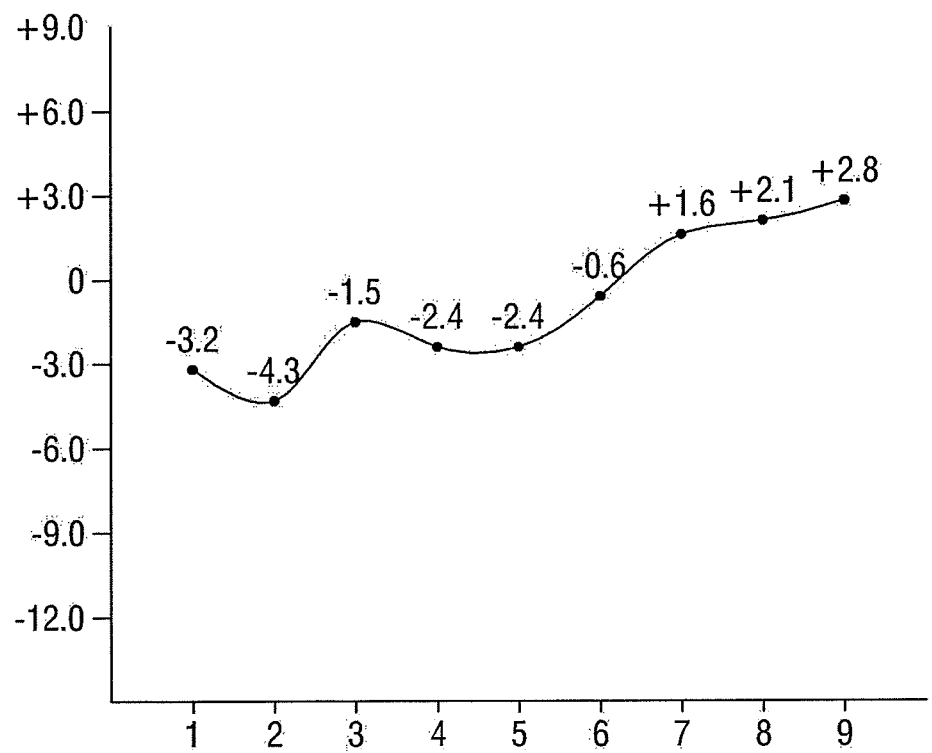

FIG. 9A illustrates overlap failure between the first patterns 111 and the second patterns 116 and 117 using the initial masks 130 in a case where the first patterns 111 are not subjected to position shifting, and FIG. 9B illustrates overlap failure between the first patterns 111 and the second patterns 116 and 117 in a case where the first patterns 111 are subjected to position shifting. FIG. 9C illustrates overlap failure between the first patterns 111 and the second patterns 116 and 117 using the customized masks 140 in a case where the first patterns 111 are not subjected to position shifting, and FIG. 9D illustrates overlap failure between the first patterns 111 and the second patterns 116 and 117 in a case where the first patterns 111 are subjected to position shifting.

Referring to FIG. 9A, when the first patterns 111 are not subjected to position shifting, i.e., when the mold structure 110 does not shrink, there is no overlap failure between the first patterns 111 and the second patterns 116 and 117 even in a case of using the initial masks 130. Here, even if a slight overlap failure occurs between the patterns, it is negligible.

Referring to FIG. 9B, when the first patterns 111 are subjected to position shifting, i.e., when the mold structure 110 shrinks, overlap failure occurs between the first patterns 111 and the second patterns 116 and 117 in a case of using only the initial masks 130, i.e., without using the customized masks 140.

Referring to FIG. 9C, when the first patterns 111 are not subjected to position shifting, overlap failure occurs between the first patterns 111 and the second patterns 116 and 117 in a case of unnecessarily using the customized masks 140.

Referring to FIG. 9D, when the first patterns 111 are subjected to position shifting, overlap failure between the first patterns 111 and the second patterns 116 and 117 can be overcome by intentionally shifting the positions of the second patterns 116 and 117 using the customized masks 140.

Figure 10:
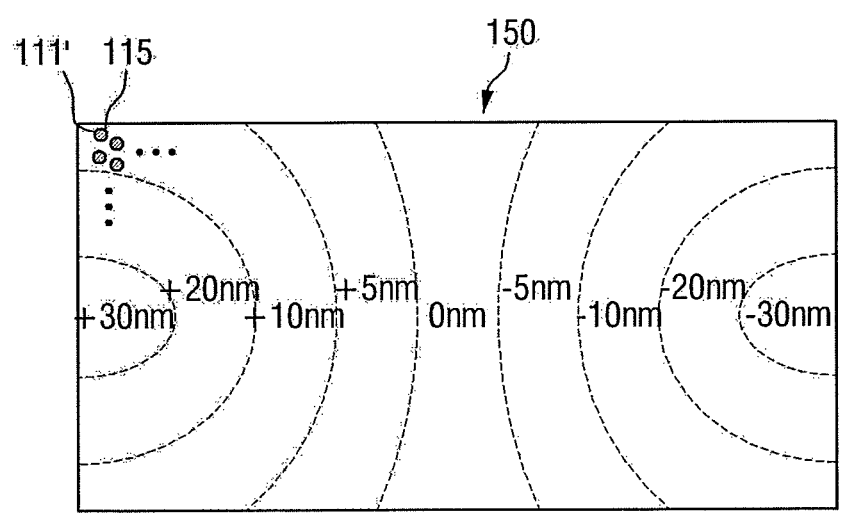
FIG. 10 illustrates a fabricating method of a customized mask according to a second embodiment.

FIG. 10 illustrates a fabricating method of a customized mask according to a second embodiment. For convenience, repeated descriptions will not be given in detail.

Referring to FIG. 10, when a high-temperature process is performed, a mold structure 150 may radially shrink in view of centers of left and right regions. That is, after performance of the high-temperature process, right and left portions of the mold structures 150 may be positioned closer to the center of the mold structure.

Accordingly, positions of at least some of the first patterns 111 formed in the mold structure 150 are shifted in radial directions. As an example, a shrinking force is radially applied to the mold structure 150 from the centers of left and right regions as points of application. Thus, as shown in FIG. 10, overlap failure data of the first patterns 111 and the second patterns 116 and 117 may be indicated by regular or irregular contour lines. As an example, the overlap failure is +30 nm in the center of the left region of the mold structure 150, and the overlap failure is (−30) nm in the center of the right region of the mold structure 150. Overlap failure levels are gradually reduced in the radial directions from the left and right regions of the mold structure 150, respectively, so the overlap failure level may reach about 0 nm in the center region of the mold structure 150.

Accordingly, when the customized masks 140 are fabricated, the overlap failure can be compensated for by gradually varying the shift directions and sizes of at least some of the mask patterns for forming the second patterns 116 and 117 of the initial masks 130 along the contour lines. Here, the overlap failure can be compensated for by gradually varying the shift directions and sizes of at least some of the mask patterns for forming the second patterns 116 and 117 of the initial masks 130 using non-continuous sections of the patterns of the initial masks 130. Alternatively, the overlap failure can be compensated for by continuously varying the shift directions and sizes of at least some of the mask patterns for forming the second patterns 116 and 117 of the initial masks 130 linearly along sections of the contour lines.

Hereinafter, a nonvolatile memory device fabricated using a customized mask according to some embodiments will be described. However, it is obvious to one skilled in the art that the present invention can be applied to all types of semiconductor devices fabricated using masks.

Figure 11:
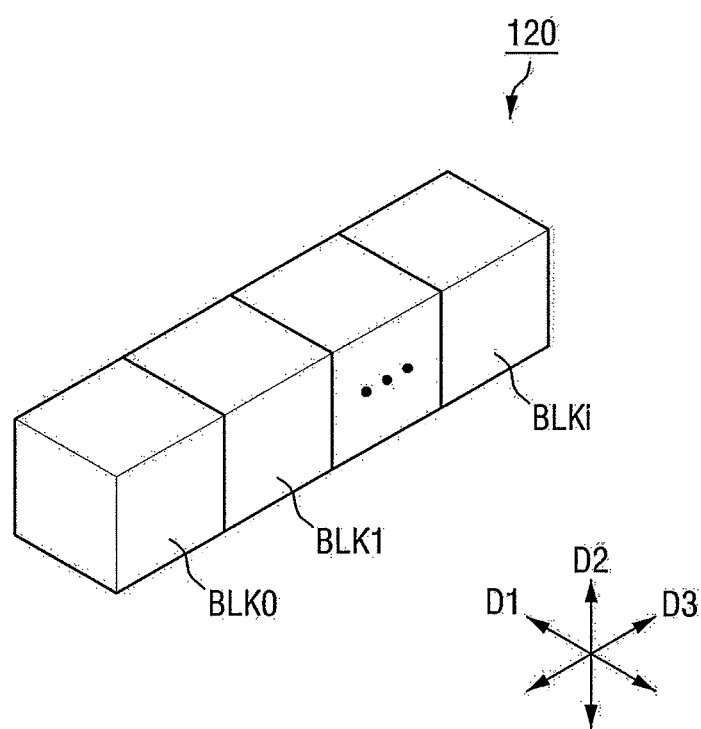
FIG. 11 illustrates a conceptual diagram for explaining a nonvolatile memory device fabricated using a customized mask according to some embodiments.
Figure 12:
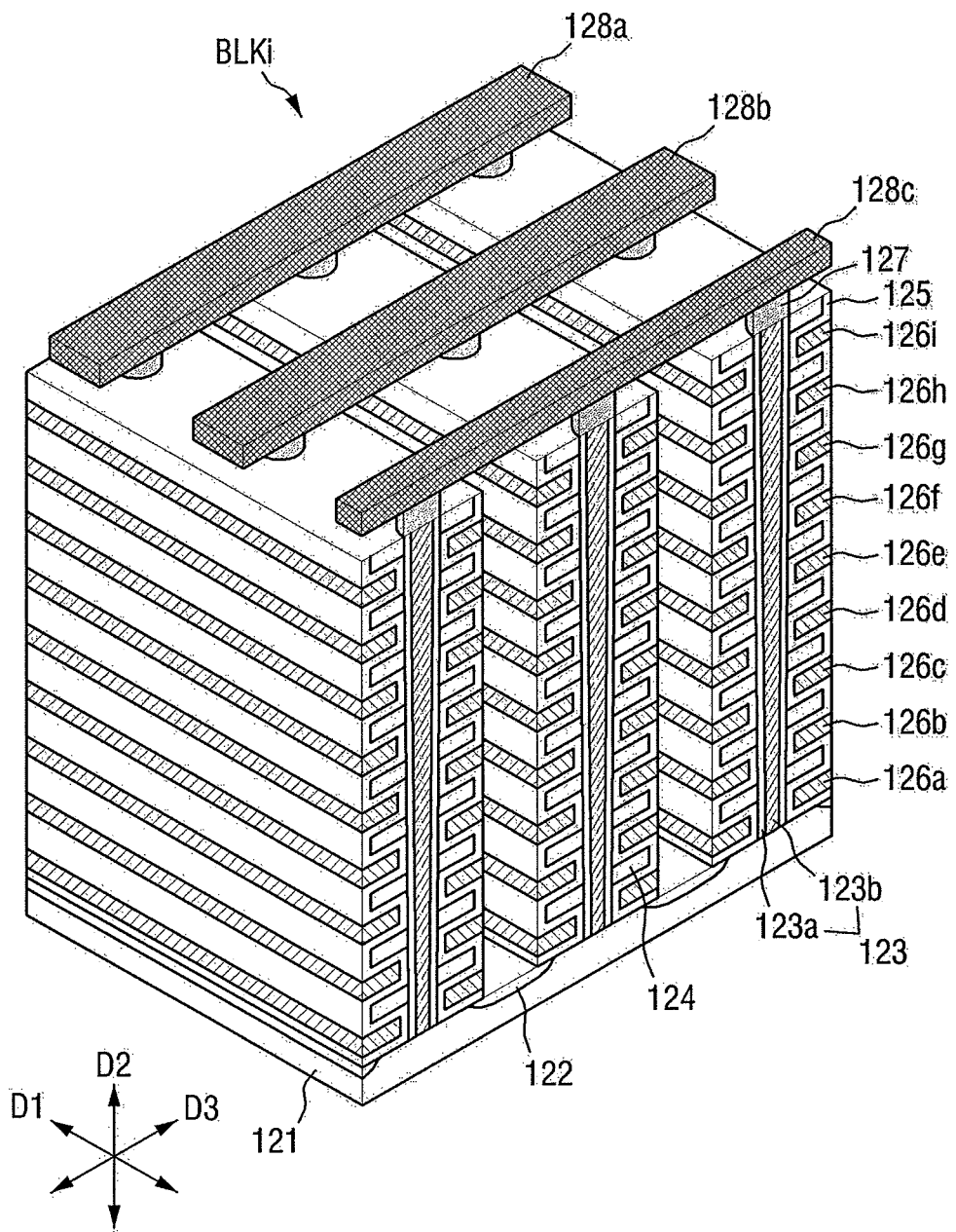
FIG. 12 illustrates a perspective view of a memory block of the nonvolatile memory device shown in FIG. 11.

FIG. 11 illustrates a conceptual diagram for explaining a nonvolatile memory device fabricated using a customized mask according to some embodiments. FIG. 12 illustrates a perspective view of a memory block of the nonvolatile memory device shown in FIG. 11.

Referring to FIG. 11, a memory cell array of a nonvolatile memory device may include multiple memory blocks BLK0 to BLKi, where i is a natural number. Each of the memory blocks BLK0 to BLKi may extend in first, second and third directions D1, D2 and D3. As shown in FIG. 11, the first, second and third directions D1, D2 and D3 may cross each other and may be different directions. For example, the first, second and third directions D1, D2 and D3 may cross each other at a right angle, but aspects of embodiments are not limited thereto.

Referring to FIG. 12, a pertinent memory block BLKi of the nonvolatile memory device, where i is a natural number, may include multiple intermediate wiring patterns 123, multiple insulation patterns 124, multiple gate patterns 126a to 126i, block layers 125, and multiple bit lines 128a to 128c, which area formed on a substrate 121. A plurality of doping regions 122 may be provided on the substrate 121. For example, the memory block BLKi may be formed of a structure equivalent to and under same conditions as the mold structure 110 discussed previously.

The multiple insulation patterns 124 may be sequentially stacked on the substrate 121 to be spaced apart from each other in the second direction D2. As shown in FIG. 12, the multiple insulation patterns 124 may be formed to extend lengthwise in the first direction D1, respectively. The insulation patterns 124 may include an oxide, but aspects of embodiments are not limited thereto.

The intermediate wiring patterns 123 may include information storage patterns 123a and channel patterns 123b, e.g., the intermediate wiring patterns 123 may be equivalent to the intermediate wiring pattern 115 in FIG. 4B. Flash memory cells may be defined at intersections of the channel patterns 123b and the gate patterns 126a to 126i.

The channel patterns 123b may be formed to extend lengthwise in the second direction D2 and the multiple gate patterns 126a to 126i may be formed to extend lengthwise in the first direction D1. In detail, the channel patterns 123b are disposed on the substrate 121 in forms of pillars to pass through the stacked multiple insulation patterns 124. The multiple gate patterns 126a to 126i are formed between each of the stacked multiple insulation patterns 124 to be spaced apart from the channel patterns 123b. The multiple gate patterns 126a to 126i may be formed to cross the channel patterns 123b. The multiple gate patterns 126a to 126i having the same thickness are exemplified in FIG. 12, but aspects of embodiments are not limited thereto. That is to say, the multiple gate patterns 126a to 126i may have different thicknesses.

The channel patterns 123b may include, e.g., a semiconductor material, such as single crystalline silicon, but aspects of embodiments are not limited thereto. The multiple gate patterns 126a to 126i may include, e.g., a conductive material, such as tungsten (W), cobalt (Co) or nickel (Ni), or a semiconductor material, such as silicon, but aspects of embodiments are not limited thereto.

The information storage patterns 123a may be formed on sidewalls of the channel patterns 123b. The information storage patterns 123a may be formed of a stack of tunnel layers and a trap layers. The tunnel layers and the trap layers may be disposed between each of the multiple gate patterns 126a to 126i and each of the channel patterns 123b. In detail, the tunnel layers and the trap layers may be formed to pass through the multiple insulation patterns 124 along the channel patterns 123b.

The tunnel layers may allow charges to pass therethrough and may be formed of, e.g., a silicon oxide layer, or a dual layered structure of a silicon oxide layer and a silicon nitride layer. The trap layers may allow the charges having passed through the tunnel layers to be stored therein. For example, the trap layers may be formed of, e.g., a nitride layer or a high-k layer. The nitride layer may include, e.g., at least one of silicon nitride, silicon oxynitride, hafnium oxynitride, zirconium oxynitride, hafnium silicon oxynitride, or hafnium aluminum oxynitride. The high-k layer may be made of, e.g., at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The block layers 125 may be disposed between each of the channel patterns 123b and each of the multiple gate patterns 126a to 126i. The block layers 125 may be formed to lengthwise extend in the first direction D1. In addition, the block layers 125 may be formed in the second direction D2 in a zigzag configuration.

The block layers 125 may be formed between upper insulation patterns 124 and the gate patterns 126a to 126i, between lower insulation patterns 124 and the gate patterns 126a to 126i, and between the channel patterns 123b (or the trap layers) and the gate patterns 126a to 126i. That is to say, the block layers 125 may be conformally formed along the insulation patterns 124 and the channel patterns 123b.

The block layers 125 may include a single layer or multiple layers. The block layers 125 may include silicon oxide or an insulating metal oxide having a greater dielectric constant than silicon oxide. For example, the block layers 125 may include, e.g., a high-k material, such as aluminum oxide, hafnium oxide, lanthanum oxide, tantalum oxide, titanium oxide, lanthanum hafnium oxide, lanthanum aluminum oxide, and/or dysprosium scandium oxide, or may be formed of a combination of stacked layers. The block layers 125 including a single layer are exemplified in FIG. 12, but embodiments are not limited thereto. The block layers 125 may include a stack of silicon oxide and aluminum oxide.

The channel patterns 123b may be spaced apart from each other in the first direction D1 and the third direction D3. That is to say, the channel patterns 123b may be arranged in a matrix configuration. The channel patterns 123b arranged in a 3×3 matrix configuration are exemplified in FIG. 12, but aspects of embodiments are not limited thereto. Here, separating spaces may be formed in the multiple insulation patterns 124 between the channel patterns 123b arranged in the third direction D3, e.g., the separating spaces in FIG. 12 may be equivalent to the separating spaces 118 in FIG. 5A.

Drain regions 127 may be provided on the multiple channel patterns 123b. The bit lines 128a to 128c may be connected to the multiple channel patterns 123b through the drain regions 127. The multiple channel patterns 123b arranged in the third direction D3 may be electrically connected to each other by the bit lines 128a to 128c.

Referring to FIG. 12, when patterning is performed for forming the separating spaces in channel holes having the intermediate wiring patterns 123 formed therein and the multiple insulation patterns 124 between the channel patterns 123b, the customized masks 140 prepared previously according to some embodiments may be used.

Figure 13:
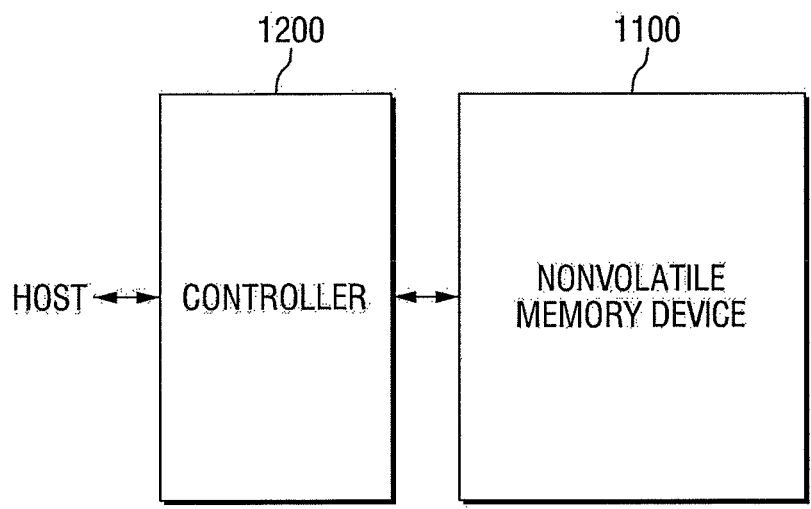
FIG. 13 illustrates a block diagram of a memory system including the nonvolatile memory device shown in FIG. 11.

FIG. 13 illustrates a block diagram of a memory system including the nonvolatile memory device shown in FIG. 11.

Referring to FIG. 13, the memory system 1000 may include a nonvolatile memory device 1100 and a controller 1200.

The memory device 1100 may be configured and driven in the same manner as described above with reference to FIG. 11. The nonvolatile memory device 1100 may be provided as, e.g., a vertical NAND flash memory.

The controller 1200 is connected to the host and the nonvolatile memory device 1100. The controller 1200 may access the nonvolatile memory device 1100 at a request from the host. For example, the controller 1200 may control read, write, erase, and background operations of the nonvolatile memory device 1100.

The controller 1200 provides interfacing between the nonvolatile memory device 1100 and the host. The controller 1200 may drive firmware for controlling the nonvolatile memory device 1100.

As an example, the controller 1200 may further include well-known components, such as a random access memory (RAM), a processing unit, a host interface, a memory interface, or the like. The RAM may be used as at least one of, e.g., an operating memory of the processing unit, a cache memory between the nonvolatile memory device 1100 and the host, and a buffer memory between the nonvolatile memory device 1100 and the host. The processing unit controls the overall operation of the controller 1200.

The host interface may include a protocol to exchange data between the host and the controller 1200. For example, the controller 1200 may be configured to communicate with an external device (host) through one of various interface protocols, e.g., universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol.

The memory interface may interface with the nonvolatile memory device 1100. Here, the memory interface may include, e.g., a NAND interface or a NOR interface.

The memory system 1000 may further include an error correction block. The error correction block may be configured to detect and correct an error of the data stored in the memory system 1100 using an error correction code (ECC). As an example, the error correction block may be provided as a component of the controller 1200. As another example, the error correction block may also be provided as a component of the nonvolatile memory device 1100.

The controller 1200 and the nonvolatile memory device 1100 may be integrated into one semiconductor device. As an example, the controller 1200 and the nonvolatile memory device 1100 may be integrated into one semiconductor device to form a memory card. For example, the controller 1200 and the nonvolatile memory device 1100 may be integrated into one semiconductor device to form, e.g., a Multi Media Card (MMC, RS-MMC, MMCmicro), a Secure Digital card (SD, miniSD, microSD), a Universal Flash storage (UFS), a PC card (originally PCMCIA or PCMCIA card), a Compact Flash (CF) card, a Smart Media (SM) Card, a memory stick, and the like, but not limited thereto.

As another example, the controller 1200 and the nonvolatile memory device 1100 may be integrated into one semiconductor device to form a Solid State Disk/Drive (SSD). The SSD includes a storage device configured to store data in a semiconductor memory. When the memory system 1000 is used as the SSD, the operating speed of the host connected to the memory system 1000 is remarkably improved.

As another example, the memory system 1000 may include or may be incorporated in, e.g., a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, but not limited thereto.

Meanwhile, as an example, the nonvolatile memory device 1100 or the memory system 1000 may be packaged in a variety of ways. For example, the nonvolatile memory device 1100 or the memory system 1000 may be mounted in, e.g., a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) or a wafer-level processed stack package (WSP).

Figure 14:
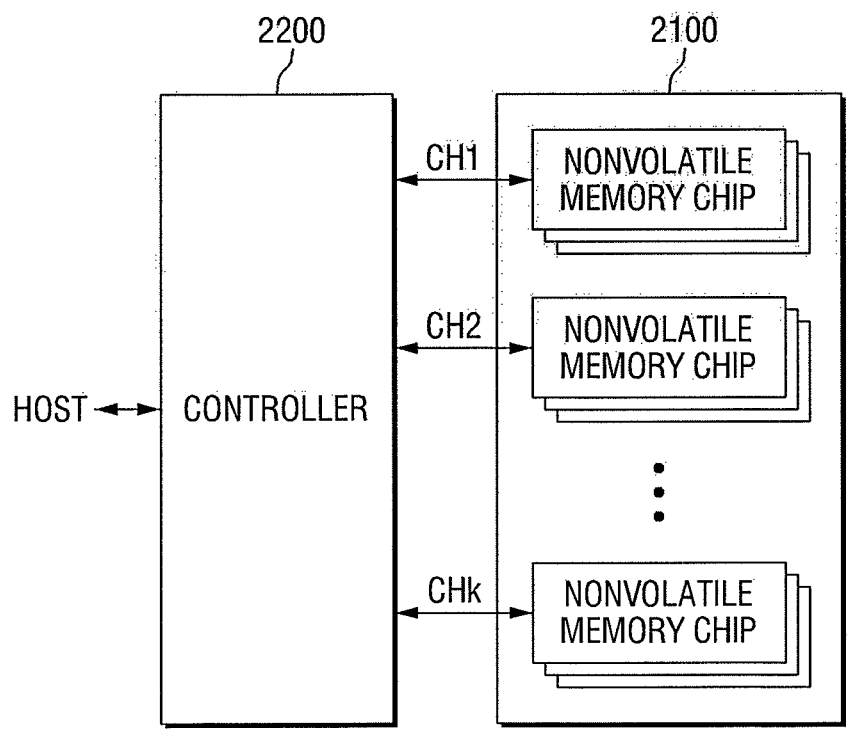
FIG. 14 illustrates a block diagram of an exemplary application example of the memory system shown in FIG. 13.

FIG. 14 illustrates a block diagram of an application example of the memory system shown in FIG. 13. Referring to FIG. 14, the memory system 2000 may include a nonvolatile memory 2100 and a controller 2200.

The nonvolatile memory 2100 may include a plurality of nonvolatile memory chips. The plurality of nonvolatile memory chips are divided into a plurality of groups. Each group of the plurality of nonvolatile memory chips is configured to communicate with the controller 2200 through a common channel. For example, the plurality of nonvolatile memory chips may communicate with the controller 2200 through first to kth channels CH1 to CHk. Each of the nonvolatile memory chips is configured in the same manner as the nonvolatile memory 100 shown in FIG. 11. While the plurality of nonvolatile memory chips connected to one channel are exemplified in FIG. 14, it can be understood by one skilled in the art that the memory system 2000 may be modified to connect one flash memory chip to one channel.

Figure 15:
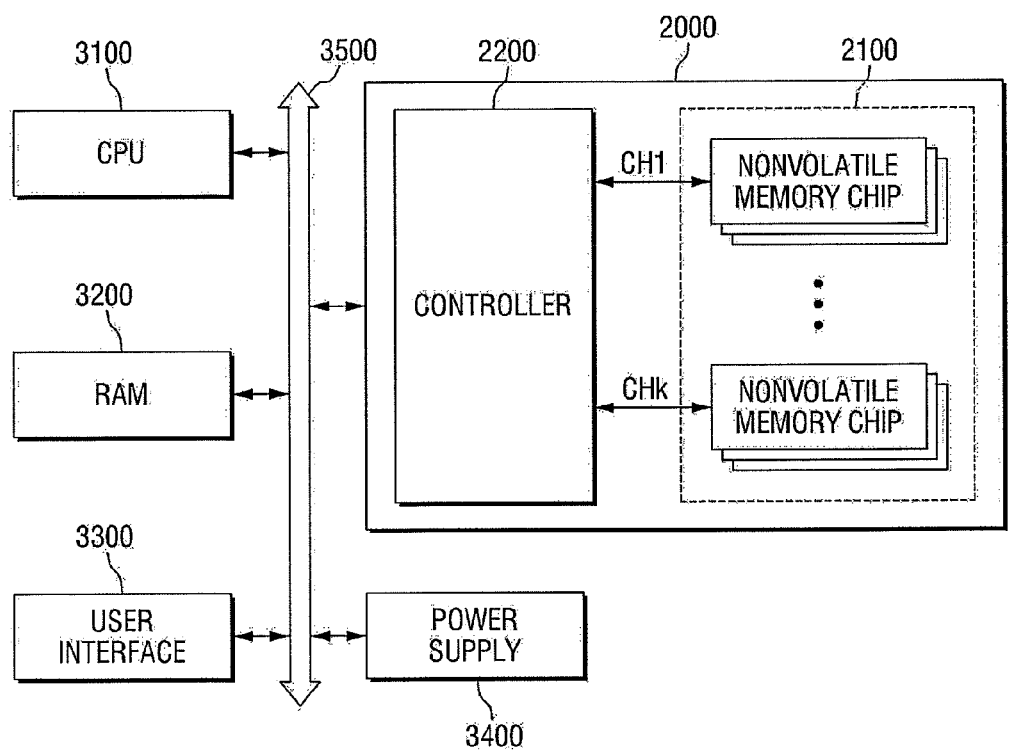
FIG. 15 illustrates a block diagram of a computing system including the memory system shown in FIG. 13 or 14.

FIG. 15 illustrates a block diagram of a computing system including the memory system shown in FIG. 13 or 14. Referring to FIG. 15, the computing system 3000 may include a central processing unit (CPU) 3100, a random access memory (RAM) 3200, a user interface 3300, a power supply 3400, and a memory system 2000.

The memory system 2000 may be electrically connected to the CPU 3100, the RAM 3200, the user interface 3300 and the power supply 3400 through the system bus 3500. The data supplied through the user interface 3300 or processed by the CPU 3100 may be stored in the memory system 2000.

In FIG. 15, the nonvolatile memories 2100 are connected to a system bus 3500 through the controller 2200. However, unlike in FIG. 15, the nonvolatile memories 2100 may be configured to be directly connected to the system bus 3500.

In FIG. 15, the memory system 2000 shown in FIG. 14 is provided in the computing system. However, the memory system 2000 may be replaced with the memory system 1000 shown in FIG. 13.

As an example, the computing system 3000 may be configured to both of the memory systems 1000 and 2000 shown in FIGS. 13 and 14.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A fabricating method of a customized mask, the fabricating method comprising:
    forming first patterns in a mold structure;
    forming second patterns in the mold structure using initial masks, the mold structure having the first patterns formed therein, such that side surfaces of the first patterns are surrounded by the second patterns;
    measuring overlap failure between the first patterns and the second patterns; and
    fabricating customized masks by compensating for pattern positions of the initial masks based on the measuring results,
    wherein compensating for the pattern positions of the initial masks includes shifting positions of at least some patterns of the initial masks according to shift directions and sizes of at least some of the first patterns.

2. The fabricating method as claimed in claim 1, further comprising performing a high-temperature process on the mold structure, before forming the second patterns using the initial masks, such that the mold structure shrinks or expands.

3. The fabricating method as claimed in claim 2, wherein compensating for the pattern positions further comprises shifting the positions of the at least some patterns of the initial masks in a same direction as a direction in which the mold structure shrinks or expands.

4. The fabricating method as claimed in claim 1, wherein compensating for the pattern positions further comprises continuously varying the shift directions and sizes of at least some of the patterns of the initial masks.

5. The fabricating method as claimed in claim 1, wherein compensating for the pattern positions further comprises gradually varying the shift directions and sizes of at least some of the patterns of the initial masks.

6. The fabricating method as claimed in claim 5, wherein compensating for the pattern positions by gradually varying the shift directions and sizes of at least some of the patterns of the initial masks includes using non-continuous sections of the patterns of the initial masks.

7. The fabricating method as claimed in claim 1, wherein compensating for the pattern positions is performed in a unit of at least one mold structure disposed within at least one shot.

8. The fabricating method as claimed in claim 1, wherein compensating for the pattern positions is performed symmetrically in left and right directions relative to a center of the mold structure.

9. A fabricating method of a semiconductor device, the fabricating method comprising:
    forming first patterns in a mold structure;
    forming second patterns in the mold structure using initial masks, the mold structure having the first patterns formed therein;
    measuring overlap failure between the first patterns and the second patterns;
    fabricating customized masks by compensating for pattern positions of the initial masks based on the measuring results; and
    patterning a plurality of layers on a substrate with the customized masks to form separating spaces between adjacent channel patterns,
    wherein compensating for the pattern positions of the initial masks includes shifting positions of at least some patterns of the initial masks according to shift directions and sizes of at least some of the first patterns.

10. The fabricating method as claimed in claim 9, further comprising performing a process on the mold structure, before forming the second patterns using the initial masks, such that the mold structure shrinks or expands.

11. The fabricating method as claimed in claim 10, wherein compensating for the pattern positions further comprises shifting the positions of the at least some patterns of the initial masks in a same direction as a direction in which the mold structure shrinks or expands.

12. The fabricating method as claimed in claim 9, wherein compensating for the pattern positions further comprises continuously varying the shift directions and sizes of at least some of the patterns of the initial masks.

13. The fabricating method as claimed in claim 9, wherein compensating for the pattern positions further comprises gradually varying the shift directions and sizes of at least some of the patterns of the initial masks.

14. The fabricating method as claimed in claim 13, wherein compensating for the pattern positions by gradually varying the shift directions and sizes of at least some of the patterns of the initial masks includes using non-continuous sections of the patterns of the initial masks.

15. The fabricating method as claimed in claim 9, wherein compensating for the pattern positions is performed symmetrically in left and right directions relative to a center of the mold structure.

16. A fabricating method of a customized mask, the fabricating method comprising:
forming first patterns in a mold structure to form a patterned mold structure;
performing a high-temperature process on the patterned mold structure, such that a width of the mold structure changes;
forming second patterns in the changed width mold structure using initial masks;
measuring overlap failure between the first patterns and the second patterns; and
fabricating customized masks by shifting positions of at least some patterns of the initial masks according to shift directions and sizes of at least some of the first patterns after the high-temperature process to minimize overlap failure between the first patterns and the second patterns.

17. The fabricating method as claimed in claim 16, wherein measuring overlap failure between the first patterns and the second patterns includes measuring alignment between the first and second patterns.

18. The fabricating method as claimed in claim 17, wherein measuring alignment between the first and second patterns includes:
measuring a first distance between a left sidewall of a second pattern and an adjacent respective side of an overlapping first pattern;
measuring a second distance between a right sidewall of the second pattern and an adjacent respective side of the overlapping first pattern; and
comparing the first distance to the second distance.

19. The fabricating method as claimed in claim 18, wherein fabricating the customized masks includes adjusting a distance between adjacent mask patterns based on the measuring results, such that a difference between the first and second distances is minimized.

20. The fabricating method as claimed in claim 16, wherein fabricating the customized masks includes adjusting a distance between adjacent patterns of the customized masks based on the measuring results, such that the first patterns are centered with respect to the second patterns.

* * * * *